United States Patent [19]

Ohkura et al.

[11] Patent Number: 5,516,753
[45] Date of Patent: May 14, 1996

[54] MULTIFILAMENTARY OXIDE SUPERCONDUCTING WIRE AND COIL FORMED BY THE SAME

[75] Inventors: Kengo Ohkura; Kenichi Sato, both of Osaka, Japan

[73] Assignees: Sumitomo Electric Industries, Ltd.; Research Development Corporation of Japan, both of Japan

[21] Appl. No.: 365,521

[22] Filed: Dec. 28, 1994

[30] Foreign Application Priority Data

Dec. 28, 1993 [JP] Japan .................................. 5-336853

[51] Int. Cl.$^6$ .................................................. H01B 12/00
[52] U.S. Cl. .......................... 505/231; 505/230; 505/431; 505/433; 505/704; 174/125.1
[58] Field of Search ..................... 505/231, 230, 505/431, 433, 704; 427/62; 174/125.1

[56] References Cited

U.S. PATENT DOCUMENTS

| | | | |
|---|---|---|---|
| 4,965,245 | 10/1990 | Sugimoto et al. | 505/1 |
| 5,330,969 | 7/1994 | Finnemore et al. | 505/431 |

FOREIGN PATENT DOCUMENTS

| | | |
|---|---|---|
| 0467237 | 1/1992 | European Pat. Off. . |
| 0504895 | 9/1992 | European Pat. Off. . |
| 0609920A2 | 8/1994 | European Pat. Off. . |

OTHER PUBLICATIONS

Appl. Phys. Lett. 61(6), 10 Aug. 1992, pp. 714–716.

*Primary Examiner*—Roy V. King
*Attorney, Agent, or Firm*—Pennie & Edmonds

[57] ABSTRACT

An oxide superconducting coil is formed by winding a superconducting multifilamentary wire consisting essentially of a plurality of filaments consisting essentially of an oxide superconductor and a stabilizing material, consisting of silver or a silver alloy, covering the filaments. Superconducting phases of the filaments are substantially rendered monophasic, and c-axes thereof are strongly oriented along the thickness of the wire. Crystal grains of the superconductor forming the filaments are in the form of flakes extending longitudinally along the wire, while the same are bonded to each other. In a section of the wire, a ratio obtained by dividing a sectional area occupied by the silver or the silver alloy by that occupied by the filaments is not more than 3. In a magnetic field of at least 10 T, the coil exhibits a critical current value which is at least 60% of that exhibited by the wire itself forming the coil.

6 Claims, 3 Drawing Sheets

FIG. 1 Ic CHARACTERISTICS OF Bi-BASED SILVER SHEATH WIRES UNDER STRESS
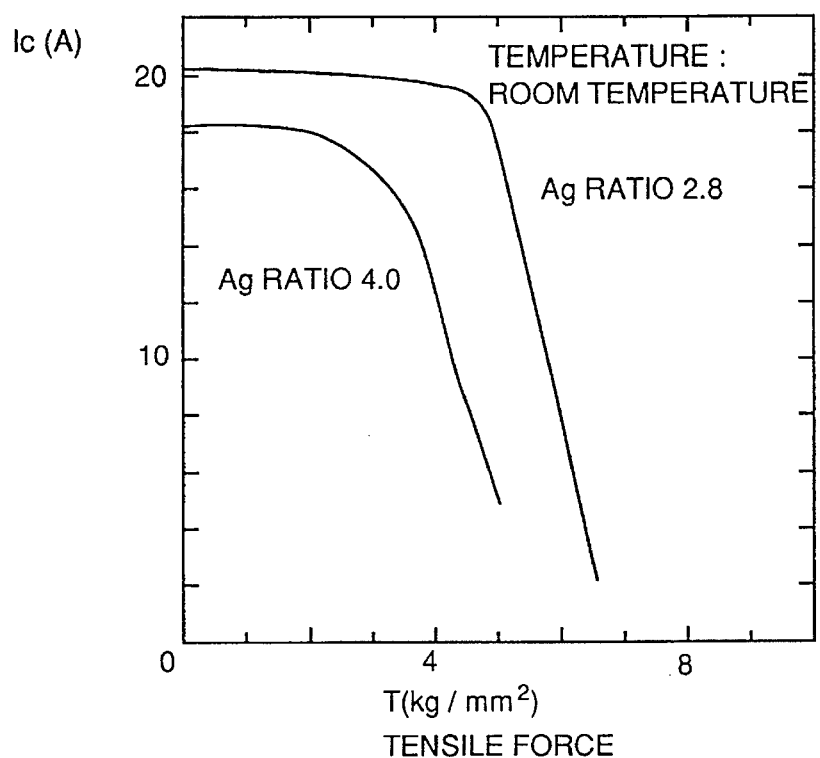
FIG. 2 Ic CHARACTERISTICS OF Bi-BASED SILVER SHEATH WIRES UNDER STRESS
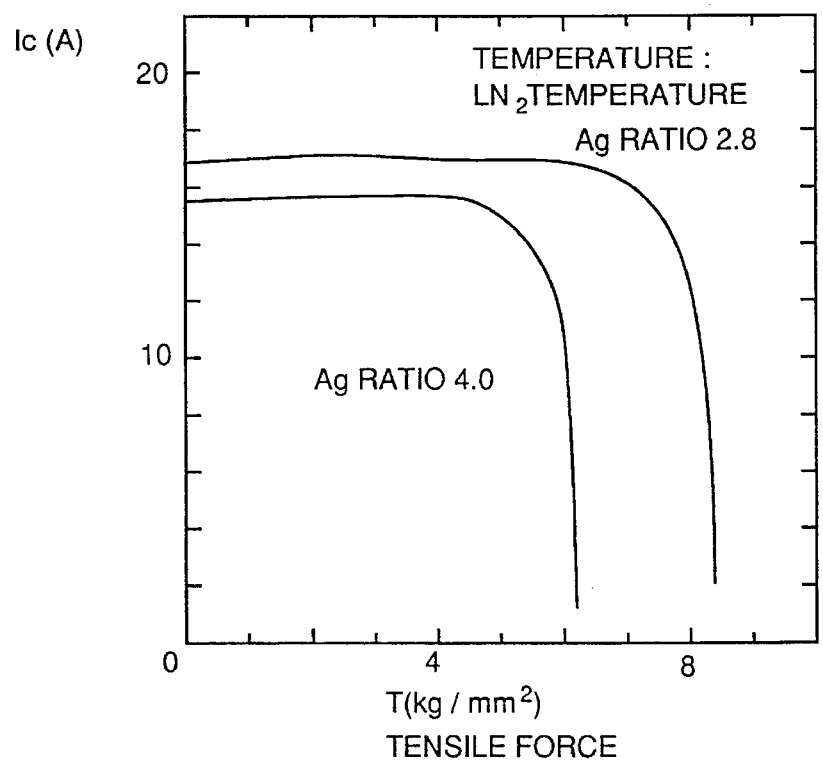

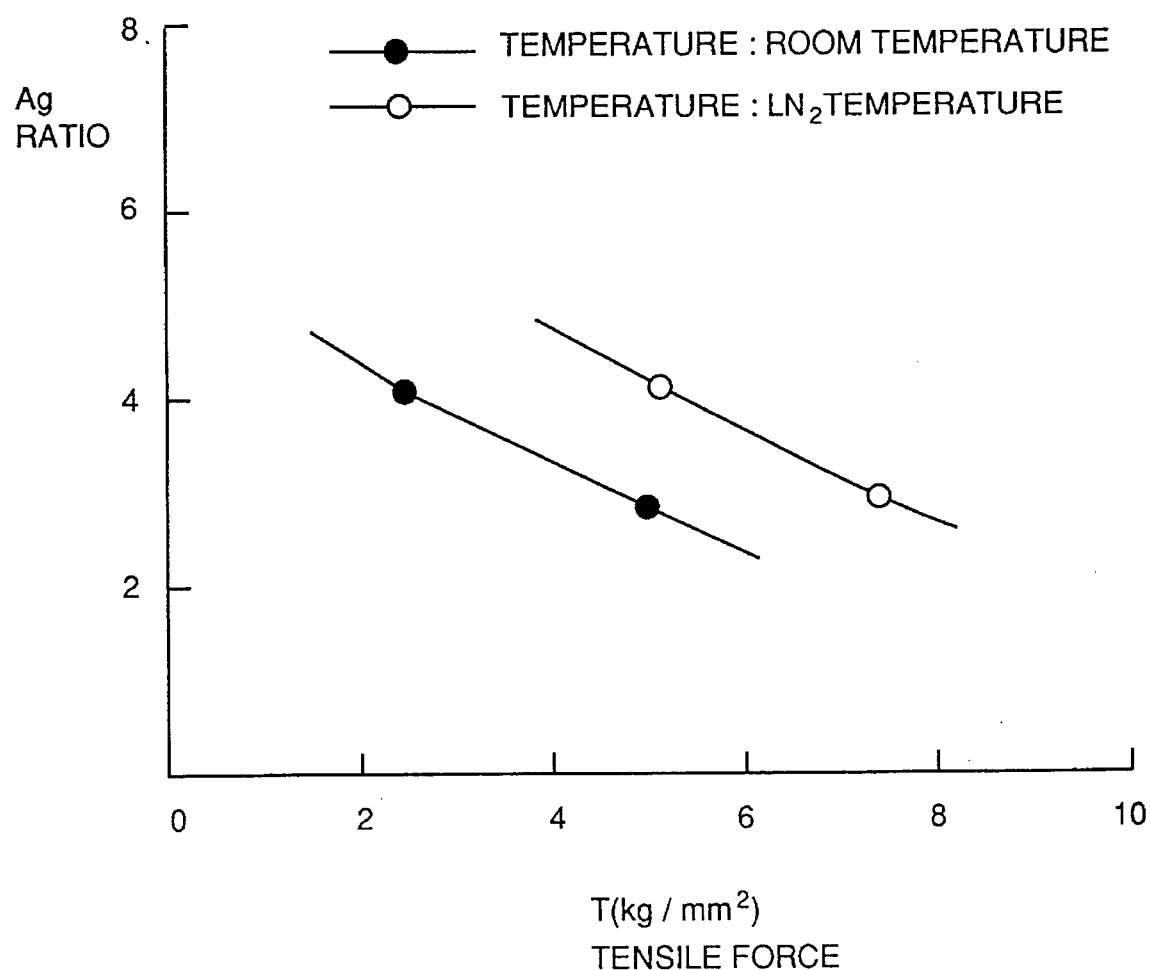

MULTIFILAMENTARY OXIDE SUPERCONDUCTING WIRE AND COIL FORMED BY THE SAME

BACKGROUND OF THE INVENTION

1. Field of the Invention

The present invention relates to a multifilamentary superconducting wire employing an oxide superconductor and an oxide superconducting coil which is applied to a high temperature superconducting magnet or the like, and more particularly, it relates to a wire and a coil which can exhibit excellent superconductivity under a high magnetic field.

2. Description of the Background Art

Due to discovery of yttrium, bismuth and thallium based oxide superconducting materials respectively exhibiting critical temperatures (Tc) of 90 K, 108 K and 125 K which are higher than the liquid nitrogen temperature of 77.3 K, application of such materials to energy and electronics fields has been expected. Under such circumstances, formation of a wire by an oxide superconductor (ceramics superconductor) has been positively developed for application to the energy field, since the discovery of this material.

For example, European Patent Laying-Open No. 0 609 920 A2 discloses a multilayer superconducting wire comprising oxide superconductor and metal layers which are alternately stacked with each other. In manufacturing of this wire, raw material powder for the oxide superconductor is mixed with a binder. The mixture as obtained is molded into a sheet, for example. The sheet as obtained is superposed with a silver sheet and spirally wound to obtain a rod. This rod is heated and charged in a silver pipe, and then subjected to hot isostatic pressing (HIP), for forming a wire. This wire is rolled into a plate material, which in turn is heat treated.

In manufacturing of an oxide superconducting wire, on the other hand, a solid phase reaction method called a powder-in-tube process is suitable for mass-producing long superconducting wires, due to employment of a technique of working an ordinary metal wire such as wire drawing or rolling. Among superconducting wires manufactured by this solid phase reaction method, a wire exhibiting a relatively high critical current at 4.2 K under a high magnetic field exceeding 20 T, for example, in relation to a silver sheath wire employing a Bi-based 2223 phase, in particular. Further, properties at 20 K are also examined (refer to Sato et al., Appl. Phys. Lett. 61(6), Aug. 10, 1992, pp. 714–716).

The technique of manufacturing a silver sheath wire by the solid phase reaction method is applied to a high temperature superconducting coil. While the temperature for using a conventional superconducting coil employing an alloy-based superconducting wire is limited to not more than 4.2 K, employment at a higher temperature can be expected in a superconducting coil formed by winding the aforementioned silver sheath wire.

As to an important technique for manufacturing a superconducting coil, it is necessary to design the coil so that the coil itself can withstand high electromagnetic stress which is generated in its interior upon generation of a high magnetic field.

In relation to such a silver sheath wire, silver forming the matrix is generally regarded as a reinforcing material. Thus, the wire is so formed that the silver occupies a high ratio in its section. When the wire is worked into a coil, however, reinforcement by silver is limited. Therefore, it is an important subject to obtain a coil which can sufficiently withstand electromagnetic stress from the silver sheath wire.

SUMMARY OF THE INVENTION

An object of the present invention is to provide an oxide superconducting wire having excellent strength to be capable of sufficiently withstanding electromagnetic stress also under a high magnetic field, and exhibiting excellent superconductivity.

Another object of the present invention is to provide a superconducting coil, obtained from a silver sheath wire, having sufficient strength and superconductivity which is hardly deteriorated under a high magnetic field.

According to the present invention, it is possible to provide a multifilamentary oxide superconducting wire. This wire consists essentially of a plurality of filaments consisting essentially of an oxide superconductor, and a stabilizing material consisting essentially of silver or a silver alloy covering the filaments. Superconducting phases of the filaments are substantially rendered monophasic, and c-axes (crystal axes) thereof are oriented along the thickness of the wire. Crystal grains of the superconductor forming the filaments are in the form of flakes extending longitudinally along the wire, and bonded to each other. In a section of the wire, a ratio, called a silver ratio, obtained by dividing a sectional area occupied by the silver or the silver alloy by that occupied by the filaments is not more than about 3. The silver ratio can be set preferably in the range of about 1.0 to about 3.0, more preferably in the range of about 1.5 to about 2.0.

An oxide superconducting coil according to the present invention is formed by winding a superconducting multifilamentary wire consisting essentially of a plurality of filaments consisting essentially of an oxide superconductor and a stabilizing material consisting essentially of silver or a silver alloy covering the filaments. Superconducting phases of the filaments are substantially rendered monophasic and c-axes thereof are strongly oriented along the thickness of the wire, while crystal grains of the superconductor forming the filaments are in the form of flakes extending longitudinally along the wire and bonded to each other. In a section of the wire, a ratio obtained by dividing a sectional area occupied by the silver or the silver alloy by that occupied by the filaments is not more than about 3. In a magnetic field of at least 10 T, the coil exhibits a critical current value which is at least 60% of that exhibited by the wire itself for forming the coil. The aforementioned magnetic field can be formed by a high magnetic field of 20 T, for example. The silver ratio can be set preferably in the range of about 1.0 to about 3.0, more preferably in the range of about 1.5 to about 2.0.

According to the present invention, the oxide superconductor is preferably a 2223 phase Bi-based ceramics superconductor such as $Bi_2Sr_2Ca_2Cu_3O_x$ or $(Bi, Pb)_2Sr_2Ca_2Cu_3O_x$.

According to the present invention, the silver alloy can be prepared from an Ag-Au, Ag-Mn, Ag-Sb, Ag-Mg, Ag-Cu or Ag-Ni alloy. The content of the element which is added to silver can be in the range of about 0.1 to about 1.0 percent by weight, for example.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates Ic characteristics of Bi-based silver sheath wires to which prescribed tensile force is applied at the room temperature;

FIG. 2 illustrates Ic characteristics of the Bi-based silver sheath wires measured with application of prescribed tensile force at the liquid nitrogen temperature;

FIG. 3 illustrates results obtained by plotting levels of tensile force starting remarkable reduction of critical currents Ic and silver ratios from the data shown in FIGS. 1 and 2;

DESCRIPTION OF THE PREFERRED EMBODIMENTS

Figure 4:
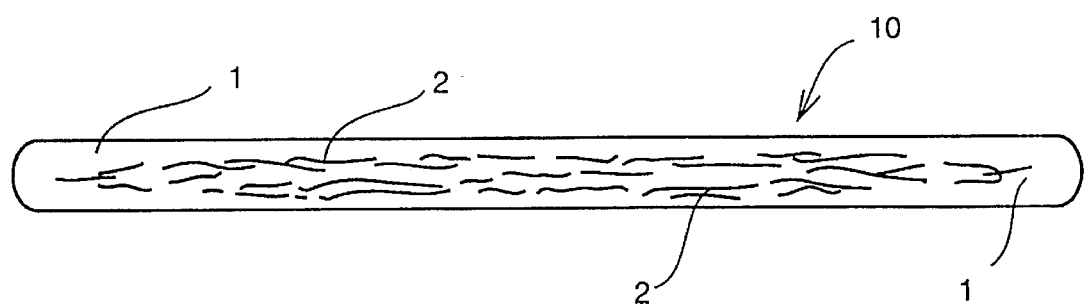
FIG. 4 is a sectional view typically showing an exemplary multifilamentary wire 10 according to the present invention. The wire 10 has such a structure that a number of oxide superconductor filaments 2 are embedded in a silver matrix 1.
Figure 5:
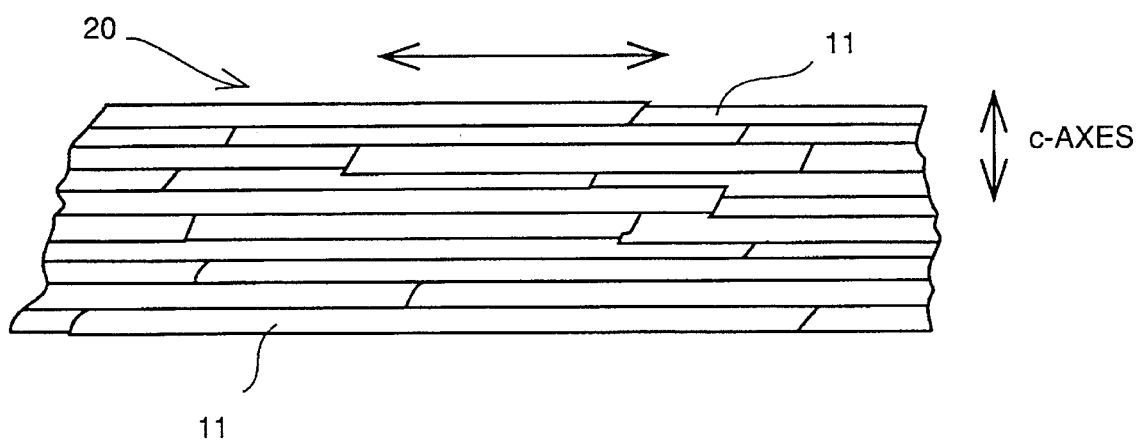
FIG. 5 typically illustrates the crystal structure of each filament 20 forming a wire according to the present invention. Crystal grains 11 in the filament 20 are in the form of thin flakes, and strongly bonded to each other. The crystal grains 11 extend longitudinally along the wire, as shown by arrow.

The inventors have discovered that a filament portion can remarkably contribute to strength of a wire as compared with silver forming a matrix in a silver sheath wire which is manufactured by the solid phase reaction method when filaments are formed by a ceramics superconductor having a homogeneous structure with well-regularized crystal orientation and excellent bonding between crystal grains. In a silver sheath wire which was obtained after sintering, on the other hand, tensile strength of the silver itself was small at about 0.1 kg/mm$^2$ in yield strength. Therefore, the inventors have tried to improve a wire and a coil formed by winding the same in strength not by silver forming matrices but by ceramics forming filaments.

FIG. 1 shows results obtained by cutting a Bi-based 61-multifilamentary tape-shaped superconducting wire which was formed in accordance with Example described later into lengths of 5 cm, applying tensile force of prescribed strength to wires as obtained at the room temperature and thereafter measuring critical currents Ic at the liquid nitrogen temperature. FIG. 2 shows results obtained by measuring the critical currents Ic of the same superconducting wires of 5 cm in length while applying tensile force in liquid nitrogen. As understood from these figures, the inventors have discovered that it is possible to suppress reduction of the critical current Ic under relatively high tensile force to some extent by reducing a silver ratio in the wire, i.e., a ratio obtained by dividing an area occupied by the silver by that occupied by the filaments in a sectional area of the wire.

FIG. 3 illustrates results obtained by plotting levels of tensile force starting remarkable reduction of the critical currents Ic and silver ratios from the data shown in FIGS. 1 and 2. As shown in FIG. 3, the tensile force deteriorating the Ic characteristics is increased by reducing the silver ratio. The above description also applies to other silver sheath multifilamentary wires.

When the temperature of the wire is reduced, movement of crystal transition is dulled and the tensile strength is increased. Therefore, the wire can withstand high stress when the same is energized at a temperature below that of liquid nitrogen.

Thus, it has been recognized preferable to calculate electromagnetic stress which may be generated in a coil to be obtained from a silver sheath wire and to set the silver ratio of the wire to be employed at a proper value in response to the calculated stress value. When tensile force starting reduction of the critical current Ic in a certain wire is recognized and a coil is manufactured by this wire, therefore, it is possible to work the wire into a coil as such if the tensile force is greater than a calculated value of electromagnetic stress. When the tensile force is less than the calculated value of the electromagnetic stress, on the other hand, the wire must be replaced by another silver sheath wire having a smaller silver ratio, for forming a coil.

On the basis of the aforementioned recognition, the inventors have discovered that a coil formed by winding a wire having a silver ratio of not more than about 3 in relation to a silver sheath wire having the aforementioned crystal structure can exhibit a critical current value of at least 60%, preferably at least 80%, of that exhibited in the state of the wire under a high magnetic field of at least 10 T, to reach the present invention. When the silver ratio exceeds about 3, it is difficult to attain a sufficient critical current value under a high magnetic field of at least 10 T, due to an influence by electromagnetic stress. In consideration of the manufacturing processes for the wire, on the other hand, the silver ratio is preferably at least 1.0, and more preferably at least 1.5.

The superconducting multifilamentary wire for forming the superconducting coil is manufactured through processes of preparing raw material powder of an oxide superconductor, charging the powder in a pipe of silver or a silver alloy, performing plastic working such as drawing, for example, bundling a plurality of wires obtained by the plastic working and engaging the same in a pipe of silver or a silver alloy, and performing plastic working such as drawing, for example, rolling and sintering. In this case, the amount of the powder, the inner and outer diameters of the pipe and the working ratio are set in response to a calculated value of electromagnetic stress which acts on the coil to be obtained, for forming a multifilamentary wire having a preferable silver ratio. The multifilamentary wire as obtained is wound in the form of a coil, and further heat treated for sintering. In the aforementioned processes, the wire is shaped into a tape after the rolling, and thereafter sintered at a temperature of about 800° to 900° C., preferably about 840° to 850° C. The rolling and sintering processes may be repeated at need. The tape as obtained is not particularly restricted in size but 1.0 to 10 mm, preferably 2 to 6 mm in width and 0.05 to 1 mm, preferably 0.1 to 0.4 mm in thickness, for example. The number of the filaments can be set in the range of 7 to 10,000, preferably in the range of 36 to 1,000.

EXAMPLE

Raw powder materials of oxides or carbonates of Bi, Pb, Sr, Ca and Cu were weighed and mixed with each other so that Bi, Pb, Sr, Ca and Cu were in ratios of 1.8:0.4:2.0:2.2:3.0, and the mixture as obtained was sintered. Powder obtained by pulverizing the sintered body was charged in a silver pipe and subjected to drawing. 61 strands as obtained were engaged in a silver pipe, and subjected to drawing and rolling. The tape-shaped wire as obtained was heat treated, rolled and thereafter wound. The coil as obtained was sintered to prepare a coil of a silver sheath wire having a Bi-based 2223 superconducting phase.

The 61-multifilamentary wire forming the coil was 0.24 mm in thickness and 2.7 mm in width. The wire forming the coil was about 100 m in length. The coil as obtained was 20 mm$\phi$ in inner diameter, 40 mm$\phi$ in outer diameter and 50 mm in height, with 670 turns.

In the aforementioned processes, wires having different silver ratios were formed through silver pipes having different inner and outer diameters with different amounts of the powder as charged, and worked into coils. A magnetic field of 20 T was applied to each of the coils as obtained, for measuring the critical current Ic of the coil at a temperature of 4.2 K. On the other hand, a magnetic field of 20 T was applied to each of short wires forming the coils, for measuring the critical current Ic at the temperature of 4.2 K. Table 1 shows the Ic values obtained in the above measurement, self-generated magnetic fields of the coils and Ic values of the short wires with the silver ratios.

TABLE 1

| Silver Ratio | Coil | | Short Wire Ic (A) | Coil Ic/ Short Wire Ic × 100 (%) |
| | Ic (A) | Self-Generated Magnetic Field (gauss) | | |
|---|---|---|---|---|
| 10.0 | 1 | 54 | 40 | 2.5 |
| 6.0 | 10 | 540 | 40 | 25 |
| 4.0 | 20 | 1080 | 40 | 50 |
| 2.8 | 35 | 1900 | 40 | 87.5 |
| 2.0 | 38 | 2063 | 40 | 95 |

Ic Measurement: at 20 T and 4.2K

From the aforementioned results, it has been clarified possible to obtain a coil which can withstand electromagnetic stress and exhibit a high Ic value also under a high magnetic field by reducing the silver ratio.

As hereinabove described, a silver sheath having highly oriented homogeneous filaments with a small silver ratio is improved in tensile strength. When the wire thus improved in strength is applied, it is possible to obtain a coil which maintains excellent superconductivity also under a high magnetic field. The present invention can attain a similar effect not only at the operating temperature of the coil but at a high temperature (20 K, for example) exceeding 4.2 K. The superconducting coil according to the present invention is usefully applied to a magnet which is employed for MRI, a linear motor car or high energy physics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconducting wire for a coil, consisting essentially of a plurality of filaments consisting essentially of an oxide superconductor and a stabilizing material, consisting essentially of silver or a silver alloy, covering said filaments, superconducting phases of said filaments being substantially rendered monophasic, with c-axes being substantially oriented along the thickness of said wire, crystal grains of said superconductor forming said filaments being in the form of flakes extending longitudinally along said wire, a ratio obtained by dividing a sectional area occupied by said silver or said silver alloy by that occupied by said filaments being not more than about 3 in a section of said wire.

2. The oxide superconducting wire in accordance with claim 1, wherein said oxide superconductor is a 2223 phase Bi-based ceramics superconductor.

3. The oxide superconducting wire in accordance with claim 1, wherein said ratio is in the range of about 1 to about 3.

4. An oxide superconducting coil being formed by winding a superconducting multifilamentary wire, consisting essentially of a plurality of filaments consisting essentially of an oxide superconductor and a stabilizing material, consisting essentially of silver or a silver alloy, covering said filaments, superconducting phases of said filaments being substantially rendered monophasic, with c-axes being substantially oriented along the thickness of said wire, crystal grains of said superconductor forming said filaments being in the form of flakes extending longitudinally along said wire, a ratio obtained by dividing a sectional area occupied by said silver or said silver alloy by that occupied by said filaments being not more than about 3 in a section of said wire, a critical current value being at least 60% of that exhibited by said wire forming said coil in a magnetic field of at least 10 T.

5. The oxide superconducting coil in accordance with claim 4, wherein said oxide superconductor is a 2223 phase Bi-based ceramics superconductor.

6. The oxide superconducting coil in accordance with claim 4, wherein said ratio is in the range of about 1 to about 3.

* * * * *